US008414858B1

(12) United States Patent
Nolas et al.

(10) Patent No.: US 8,414,858 B1
(45) Date of Patent: Apr. 9, 2013

(54) METHOD FOR SOLID STATE CRYSTAL GROWTH

(75) Inventors: George S. Nolas, Tampa, FL (US); Matthew K. Beekman, Eugene, OR (US)

(73) Assignee: University of South Florida, Tampa, FL (US)

( * ) Notice: Subject to any disclaimer, the term of this patent is extended or adjusted under 35 U.S.C. 154(b) by 356 days.

(21) Appl. No.: 12/859,534

(22) Filed: Aug. 19, 2010

Related U.S. Application Data

(60) Provisional application No. 61/235,215, filed on Aug. 19, 2009.

(51) Int. Cl.
*B01D 9/00* (2006.01)
(52) U.S. Cl.
USPC .......................... 423/344; 23/295 R; 23/296
(58) Field of Classification Search ............... 23/295 R, 23/296, 302 R, 302 T; 423/344
See application file for complete search history.

(56) References Cited

U.S. PATENT DOCUMENTS

| | | | |
|---|---|---|---|
| 6,103,403 A | 8/2000 | Grigorian et al. |
| 6,188,011 B1 | 2/2001 | Nolas et al. |
| 6,423,286 B1 | 7/2002 | Gryko |
| 6,461,581 B1 | 10/2002 | Eguchi et al. |
| 6,797,199 B2 | 9/2004 | Eguchi et al. |
| 7,534,414 B2 | 5/2009 | Nolas et al. |

OTHER PUBLICATIONS

Kawaji et al. 1995. "Superconductvity in the Silicon Clathrate Compound (Na,Ba)xSi46." Physical Review Letters. vol. 74. No. 8. pp. 1427-1429.
Cohn et al. 1999. "Glasslike Heat Conduction in High-Mobility Crystalline Semiconductors." Physical Review Letters. vol. 82. No. 4. pp. 779-782.
Hermann et al. 2006. "Direct Experimental Evidence for Atomic Tunneling of Europium in Crystalline Eu8Ga16Ge30." Physical Review Letters. pp. 017401-1-017401-4.
Nolas et al. 1998. "Semiconducting Ge Clathrates: Promising Candidates for Thermoelectric Applications." Applied Physics Letters. vol. 73. No. 2. pp. 178-180.
Shi et al. 2010. "On the Design of High-Efficiency Thermoelectric Clathrates Through a Systematic Cross-Substitution of Framework Elements." Adv. Funct. Mater. vol. 20. pp. 755-763.
Guloy et al. 2006. "A Guest-Free Germanium Clathrate." Nature. vol. 443 pp. 320-323.
Bohme et al. 2007. "Oxidation of M4Si4 (M = Na, K) to Clathrates by HCl or H2O." J. Am. Chem. Soc. vol. 129. pp. 5348-5349.
Neiner et al. 2007. "Hydrogen Encapsulation in a Silicon Clathrate Type I Structure: Na5.5(H2)2.15Si46: Synthesis and Characterization." J. Am. Chem. Soc. vol. 129. pp. 13857-13862.
San-Miguel et al. 2005. "High-Pressure Properties of Group IV Clathrates." High Pressure Research. vol. 25. No. 3. pp. 159-185.
Wosylus et al. 2009. "Cs8-xSi46: A Type-I Clathrate with Expanded Silicon Framework." Chem. Eur. J. vol. 15. pp. 5901-5903.

Kaltzoglou et al. 2008. "A4Ge9 (A = K, Rb) as Precursors for Hg-Substituted Clathrate-I Synthesis: Crystal Structure of A8Hg3Ge43." Eur. J. Inorg. Chem. pp. 4507-4510.
Sales et al. 2001. "Structural Magnetic, Thermal, and Transport Properties of X8Ga16Ge30 (X = Eu, Sr, Ba) Single Crystals." Physical Review B. vol. 63. pp. 245113-1-245113-8.
Christensen et al. 2008. "Avoided Crossing of Rattler Modes in Thermoelectric Materials." Nature Materials. vol. 7. pp. 811-815.
Condron et al. 2006. "Structure and Thermoelectric Characterization of Ba8Al14Si31." Inorganic Chemistry. vol. 45. No. 23. pp. 9381-9386.
Tanaka et al. 2010. "Interplay Between Thermoelectric and Structural Properties of Type-I Clathrate K8Ga8Sn38 Single Crystals." Physical Review B. vol. 81. pp. 165110-1-165110-6.
Beekman et al. 2008. "Inorganic Clathrate-II Materials of Group 14: Synthetic Routes and Physical Properties." J. Mater. Chem. vol. 18. pp. 842-851.
Kasper et al. 1965. "Clathrate Structure of Silicon Na8Si46 and NaxSi136 (x < 11)." Science, New Series. vol. 150. No. 3704. pp. 1713-1714.
Tse et al. 2000. "Structural Principles and Amorphouslike Thermal Conductivity of Na-Doped Si Clathrates." Physical Review Letters. vol. 85. No. No. 1. pp. 114-117.
Cros et al. 1970. "Sur Une Nouvelle Famille de Clathrates Mineraux Isotypes des Hydrates de Gaz et de Liquides. Interpretation des Resultats Obtenus." Journal of Solid State Chemistry. vol. 2. pp. 570-581.
Horie et al. 2009. "Controlled Thermal Decomposition of NaSi to Derive Silicon Clathrate Compounds." Journal of Solid State Chemistry. vol. 182. pp. 129-135.
Reny et al. 1998. "Structural Characterisations of the NaxSi136 and Na8Si46 Silicon Clathrates Using the Rietveld Method." J. Mater. Chem. vol. 8. pp. 2839-2844.
Ramachandran et al. 1999. "Synthesis and X-Ray Characterization of Silicon Clathrates." Journal of Solid State Chemistry. vol. 145. pp. 716-730.
Cross et al. 1968. "Sur Deux Composes du Potassium Isotypes de L'hydrate de Krypton." Bull. Soc. Chim. France. No. 7. pp. 2737-2741.
Beekman et al. 2009. "Preparation and Crystal Growth of Na24Si136." J. Am. Chem. Soc. vol. 131. pp. 9642-9643.
Beekman et al. 2010. "Intrinsic Electrical and Thermal Properties from Single Crystals of Na24Si136." Physical Review Letters. vol. 104. pp. 018301-1-018301-4.

(Continued)

*Primary Examiner* — Edward Johnson
(74) *Attorney, Agent, or Firm* — Michele L. Lawson; Smith & Hopen, P.A.

(57) ABSTRACT

A novel method for high quality crystal growth of intermetallic clathrates is presented. The synthesis of high quality pure phase crystals has been complicated by the simultaneous formation of both clathrate type-I and clathrate type-II structures. It was found that selective, phase pure, single-crystal growth of type-I and type-II clathrates can be achieved by maintaining sufficient partial pressure of a chemical constituent during slow, controlled deprivation of the chemical constituent from the primary reactant. The chemical constituent is slowly removed from the primary reactant by the reaction of the chemical constituent vapor with a secondary reactant, spatially separated from the primary reactant, in a closed volume under uniaxial pressure and heat to form the single phase pure crystals.

22 Claims, 12 Drawing Sheets

OTHER PUBLICATIONS

Morito et al. 2009. "Na-Si Binary Phase Diagram and Solution Growth of Silicon Crystals." Journal of Alloys and Compounds. vol. 480. pp. 723-726.

Morito et al. 2010. "Double-Helical Silicon Microtubes." Agnew. Chem. Int. Ed. vol. 49. pp. 3638-3641.

Brunet et al. 2000. "Peierls or Jahn-Teller Effect in Endohedrally Doped Silicon Clathrates: An EXAFS Study." Physical Review B. vol. 61. No. 24. pp. 16 550-16 560.

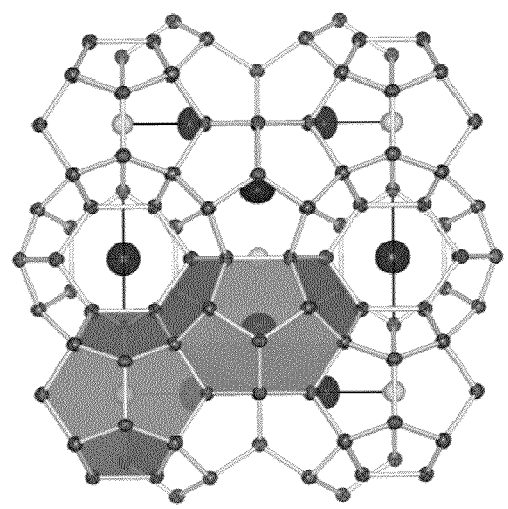
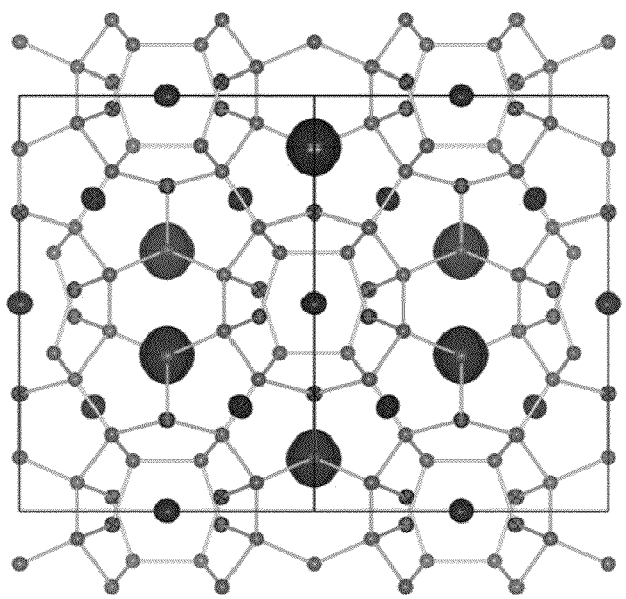
Fig. 4

**Atomic coordinates and equivalent* isotropic atomic displacement parameters ($Å^2$) for $Na_8Si_{46}$.**

| Atom | Wyckof position | x/a | y/b | z/c | $U_{eq}$ |
|---|---|---|---|---|---|
| Na1 | 2a | 0.0000 | 0.0000 | 0.0000 | 0.0145(3) |
| Na2 | 6d | 0.5000 | 0.0000 | 0.2500 | 0.0296(3) |
| Si1 | 24k | 0.30782(3) | 0.11728(3) | 0.0000 | 0.00637(9) |
| Si2 | 6c | 0.5000 | 0.2500 | 0.0000 | 0.00621(12) |
| Si3 | 16i | 0.184101(18) | 0.184101(18) | 0.184101(18) | 0.00638(9) |

* $U_{eq}$ is defined as one third of the trace of the orthogonalized $U_{ij}$ tensor.

Fig. 5

**Anisotropic atomic displacement parameters* ($Å^2$) for $Na_8Si_{46}$.**

| Atom | $U_{11}$ | $U_{22}$ | $U_{33}$ | $U_{23}$ | $U_{13}$ | $U_{12}$ |
|---|---|---|---|---|---|---|
| Na1 | 0.0145(3) | 0.0145(3) | 0.0145(3) | 0.000 | 0.000 | 0.000 |
| Na2 | 0.0346(4) | 0.0346(4) | 0.0196(6) | 0.000 | 0.000 | 0.000 |
| Si1 | 0.00635(13) | 0.00613(13) | 0.00662(13) | 0.000 | 0.000 | -0.00025(9) |
| Si2 | 0.00603(15) | 0.0066(3) | 0.00603(15) | 0.000 | 0.000 | 0.000 |
| Si3 | 0.00638(9) | 0.00638(9) | 0.00638(9) | -0.00013(6) | -0.00013(6) | -0.00013(6) |

- The anisotropic atomic displacement factor exponent takes the form: $-2\pi^2 [h^2a^{*2}U_{11} + ... + 2hka^*b^*U_{12}]$

Fig. 6

Bond lengths (Å) for Na$_8$Si$_{46}$

| | | |
|---|---|---|
| Na1-Si1 | 3.3590(3) | 12 |
| Na1-Si3 | 3.2516(2) | 8 |
| | | |
| Na2-Si1 | 3.4307(2) | 8 |
| Na2-Si1 | 3.9470(3) | 4 |
| Na2-Si2 | 3.6053(1) | 4 |
| Na2-Si3 | 3.7885(3) | 8 |
| | | |
| Si1-Si1 | 2.3919(6) | |
| Si1-Si2 | 2.3816(3) | |
| Si1-Si3 | 2.3623(2) | 2 |
| | | |
| Si2-Si1 | 2.3816(3) | 4 |
| | | |
| Si3-Si1 | 2.3623(2) | 3 |
| Si3-Si3 | 2.3279(7) | |

Fig. 7

**Atomic coordinates and equivalent* isotropic atomic displacement parameters (Å$^2$) for Na$_{24}$Si$_{136}$.**

| Atom | Wyckoff position | x/a | y/b | z/c | $U_{eq}$ |
|---|---|---|---|---|---|
| Na1** | 8b | 0.1250 | 0.1250 | 0.1466(7) | 0.049(3) |
| Na2 | 16c | 0.5000 | 0.0000 | 0.0000 | 0.0152(2) |
| Si1 | 8a | 0.6250 | 0.1250 | 0.1250 | 0.00613(18) |
| Si2 | 32c | 0.871284(19) | 0.067382(13) | 0.067382(13) | 0.00649(8) |
| Si3 | 96g | 0.717951(19) | 0.032049(19) | 0.032049(19) | 0.00636(10) |

* $U_{eq}$ is defined as one third of the trace of the orthogonalized $U_{ij}$ tensor.
** Na1 occupation factor = $1/6$.

Fig. 8

Anisotropic atomic displacement parameters* ($Å^2$) for $Na_{24}Si_{136}$.

| Atom | $U_{11}$ | $U_{22}$ | $U_{33}$ | $U_{23}$ | $U_{13}$ | $U_{12}$ |
|---|---|---|---|---|---|---|
| Na1 | 0.056(4) | 0.056(4) | 0.034(4) | 0.000 | 0.000 | 0.000(2) |
| Na2 | 0.0152(2) | 0.0152(2) | 0.0152(2) | -0.0011(3) | -0.0011(3) | -0.0011(3) |
| Si1 | 0.00613(18) | 0.00613(18) | 0.00613(18) | 0.000 | 0.000 | 0.000 |
| Si2 | 0.00683(13) | 0.00632(9) | 0.00632(9) | 0.00040(9) | 0.00002(6) | 0.00002(6) |
| Si3 | 0.00636(10) | 0.00636(10) | 0.00636(10) | -0.00001(9) | 0.00001(9) | 0.00001(9) |

*The anisotropic atomic displacement factor exponent takes the form: $-2\pi^2 [ h^2 a^{*2} U_{11} + ... + 2hka^*b^*U_{12} ]$

Fig. 9

Bond lengths (Å) for $Na_{24}Si_{136}$.

| | | |
|---|---|---|
| Na1-Si2 | 3.619(10) | 2 |
| Na1-Si2 | 3.785((7) | 4 |
| Na1-Si2 | 3.8642(15) | 4 |
| Na1-Si2 | 4.001(3) | 4 |
| Na1-Si2 | 4.0114(7) | 2 |
| Na1-Si2 | 4.0201(10) | 2 |
| Na1-Si2 | 4.225(10) | 2 |
| Na1-Si2 | 4.234(8) | 4 |
| Na1-Si3 | 3.827(5) | 2 |
| Na1-Si3 | 4.194(7) | 2 |
| | | |
| Na2-Si1 | 3.1853(1) | 2 |
| Na2-Si2 | 3.3742(2) | 12 |
| Na2-Si3 | 3.2751(3) | 6 |
| | | |
| Si1-Si3 | 2.3685(5) | 4 |
| | | |
| Si2-Si2 | 2.3578(3) | 2 |
| Si2-Si2 | 2.3976(6) | |
| Si2-Si3 | 2.3726(3) | |
| | | |
| Si3-Si1 | 2.3686(5) | |
| Si3-Si2 | 2.3726(3) | 3 |

Fig. 10

METHOD FOR SOLID STATE CRYSTAL GROWTH

CROSS REFERENCE TO RELATED APPLICATIONS

This application claims priority to currently pending U.S. Provisional Patent Application No. 61/235,215, entitled "Novel Method for Solid State Crystal Growth", filed on Aug. 19, 2009, the contents of which are herein incorporated by reference.

GOVERNMENT SUPPORT

This invention was made with government support under Grant No. DE-FG02-04ER46145 awarded by the U.S. Department of Energy. The government has certain rights in the invention.

FIELD OF INVENTION

This invention relates to a novel method for high quality crystal growth of intermetallic materials. Specifically the invention relates to methods of producing single-crystal growth of intermetallic clathrates as well as the synthesizing of a novel clathrate compound.

BACKGROUND OF THE INVENTION

The commercial usefulness of many technologies is limited by the materials they utilize. Many intermetallic materials have yet to achieve their commercial promise due to challenges in the preparation of high quality crystalline product. These challenges often stem from physical characteristics of the compound's constituent elements. Since improvements upon existing materials are often not enough to provide significant advancements, new materials, structures, and/or approaches must be found. As an example, intermetallic clathrates are a novel class of materials currently being widely investigated for the potential they hold to impact and address a number of materials limited problems in energy conversion applications. The realization of the expected properties for these materials may revolutionize the commercial viability of important applications such as thermoelectric power generation and photovoltaic energy conversion. However, one of the substantial challenges to this realization lies in the preparation and crystal growth of high quality materials, which includes precise control over chemical composition, production of high quality crystalline product, and an inexpensive, reproducible, and safe method for manufacturing these materials. The present invention addresses these problems, and offers a new, industrially accessible and cost-effective method for crystal growth of intermetallic materials which cannot be prepared by conventional techniques, as well as a number of other materials as well. A key advantage of the invention is the ability to grow high quality single crystals of materials including constituent elements with greatly differing melting points and vapor pressures, or both.

Several applications/markets will benefit from the new crystal growth method presented herein, such as: high efficiency photovoltaic solar cells; high efficiency thermoelectric modules for power conversion, for use in automotive waste heat recovery, onboard power generation for deep space probes (NASA) and military applications; light detectors that may be integrated into current Si-based technologies; various optoelectronic devices; novel semiconductor materials for electronics applications; electronic devices with low thermal conductance; semiconductor devices operating at elevated temperatures (i.e. >300 K); thermoelectric cooling devices used for infrared sensors, fiber optic guidance systems, charged coupled devices, thermal reference sources, laser diodes, pump lasers, refrigerators/freezers, bio-analytical instrumentation, DNA amplification, high performance liquid chromatography, and supercritical fluid chromotography; and thermal management for biological systems.

As stated above, one of the significant challenges to high quality crystal growth of many intermetallic clathrate compositions, in particular compositions that exhibit technological and commercial usefulness such as the clathrate-II $Na_xSi_{136}$ (0<x<24), are the vast difference between the melting points of the constituent elements, the vast difference in vapor pressures of the constituent elements, and the need for control of the partial pressures of the constituents for control of reaction products. These challenges exclude the use of conventional crystal growth techniques for preparation of these materials. Although the $Na_xSi_{136}$ clathrates have been known for more than forty years, crystal growth of these materials has remained elusive.

The novel invention disclosed herein is a method that is a marked improvement over previous methods of making $Na_xSi_{136}$ clathrates. Prior art in the field has traditionally centered on the production of microcrystalline powders by thermal decomposition. (see U.S. Pat. Nos. 6,461,581 and 6,797,199 to Eguchi et al.) For example, in U.S. Pat. No. 6,423,286 to Gryko, a method for making $Na_xSi_{136}$ clathrates was described, however the products of this method still contained measurable amounts of impurity phases. Moreover, the products were microcrystalline powders, not single phase pure crystals. The present invention, in contrast, produces $Na_{24}Si_{136}$ as high quality single crystals, and also in completely phase pure form, by a method that could readily be utilized in industry.

U.S. Pat. No. 6,103,403 to Grigorian discloses a method of manufacturing a silicon clathrate film that is bonded to a silicon substrate. The method produces a silicon clathrate layer and an intermediate n-type silicon layer on the silicon substrate. This patent does not produce phase pure high quality crystals as are produced in the present invention.

U.S. Pat. No. 7,534,414 to Nolas et al. discloses a method for the production of type II clathrates in thin and thick film form for use in photovoltaic (PV), thermoelectric (TE) and/or optoelectronic applications. This patent is limited to type II clathrates and similarly to those discussed above, does not disclose the production of phase pure high quality single crystals of both type I and type II clathrates.

As shown by the disclosures of the prior art, a method of high quality crystal growth of the type-I and type-II clathrates is needed. The present invention offers a new, industrially accessible and cost-effective method for crystal growth of intermetallic materials. The method of the invention enables the growth of high quality single crystals of materials including constituent elements with greatly differing melting points and vapor pressures, or both.

SUMMARY OF INVENTION

In a first embodiment, a method for selective preparation of single phase pure intermetallic crystals is presented, comprising the steps of: positioning a primary reactant into a reaction apparatus; positioning a secondary reactant into the reaction apparatus; positioning an inert diffusion facilitating separation layer between the secondary reactant and the primary reactant; applying heat and pressure to the reaction apparatus; and controlling the release of vapor of at least one chemical constituent of the primary reactant whereby the controlled release results in a change in composition of the primary reactant.

Graphite foil can be positioned around the outer diameter of the primary and secondary reactants and the diffusion facilitating layer to encapsulate the reactants and diffusion facilitating layer in order to impede the escape of the chemical constituent vapor and to facilitate the removal of the crystals from the reaction apparatus.

The primary reactant can be selected from the group consisting of NaSi, NaGe, NaSn, KSi, KGe, KSn, RbSi, RbGe, RbSn, CsSi, CsGe, CsSn, BaSi$_2$, BaGe$_2$, BaSn$_2$, SrSi$_2$, SrGe$_2$, SrSn$_2$, Na$_{1-x}$K$_x$Si$_2$, Na$_{1-x}$K$_x$Ge$_2$, Na$_{1-x}$K$_x$Sn$_2$, Na$_{1-x}$Rb$_x$Si$_2$, Na$_{1-x}$Rb$_x$Ge$_2$, Na$_{1-x}$Rb$_x$Sn$_2$, Na$_{1-x}$Cs$_x$Si$_2$, Na$_{1-x}$Cs$_x$Ge$_2$, Na$_{1-x}$Cs$_x$Sn$_2$, K$_{1-x}$Rb$_x$Si$_2$, K$_{1-x}$Rb$_x$Ge$_2$, K$_{1-x}$RbSn$_2$, K$_{1-x}$Cs$_x$Si$_2$, K$_{1-x}$Cs$_x$Ge$_2$, K$_{1-x}$Cs$_x$Sn$_2$, Rb$_{1-x}$Cs$_x$Si$_2$, Rb$_{1-x}$Cs$_x$Ge$_2$, Rb$_{1-x}$Cs$_x$Sn$_2$, NaSi$_{1-y}$Ge$_y$, KSi$_{1-y}$G$_y$, RbSi$_{1-y}$Ge$_y$, CsSi$_{1-y}$Ge$_y$, Na$_{1-x}$K$_x$Si$_{1-y}$Ge$_y$, Na$_{1-x}$Rb$_x$Si$_{1-y}$Ge$_y$, Na$_{1-x}$Cs$_x$Si$_{1-y}$Ge$_y$, K$_{1-x}$Rb$_x$Si$_{1-y}$Ge$_y$, K$_{1-x}$Cs$_x$Si$_{1-y}$Ge$_y$, and Rb$_{1-x}$Cs$_x$Si$_{1-y}$Ge$_y$, (0<x, y<1), or any variation, combination, mixture, alloy, or solid solution of any of these compounds.

The primary reactant can be reduced chemically or by evaporation to result in single phase pure intermetallic crystals with less than 100% alkali metal or alkali earth metal occupancy in the crystal structure. For example, Na$_x$Si$_{136}$ and K$_x$Si$_{136}$ where 0<=x<24.

The primary reactant can be Na$_4$Si$_4$ and K$_4$Si$_4$. In this embodiment, the reactants are heated between about 580° C. and 590° C. to produce type-I clathrates Na$_8$Si$_{46}$ and K$_8$Si$_{46}$. The reactants can be heated between about 650° C. and 670° C. to produce type-II clathrates Na$_{24}$Si$_{136}$ and K$_{24}$Si$_{136}$. The reactants can be heated for between about 6 hours and about 8 hours.

The secondary reactant can be positioned above and below the primary reactant and can be selected from the group consisting of carbon, graphite and glass. The diffusion facilitating layer can be selected from the group consisting of NaCl and BaF.

In another embodiment, a method of producing intermetallic crystals is presented comprising the steps of: positioning a primary reactant within a reaction apparatus; applying heat and pressure to the reaction apparatus; and manually controlling the release of vapor of at least one chemical constituent of the primary reactant whereby the controlled release results in a change in composition of the primary reactant.

The primary reactant can be selected from the group consisting of NaSi, NaGe, NaSn, KSi, KGe, KSn, RbSi, RbGe, RbSn, CsSi, CsGe, CsSn, BaSi$_2$, BaGe$_2$, BaSn$_2$, SrSi$_2$, SrGe$_2$, SrSn$_2$, Na$_{1-x}$K$_x$Si$_2$, Na$_{1-x}$K$_x$Ge$_2$, Na$_{1-x}$K$_x$Sn$_2$, Na$_{1-x}$Rb$_x$Si$_2$, Na$_{1-x}$Rb$_x$Ge$_2$, Na$_{1-x}$Rb$_x$Sn$_2$, Na$_{1-x}$Cs$_x$Si$_2$, Na$_{1-x}$Cs$_x$Ge$_2$, Na$_{1-x}$Cs$_x$Sn$_2$, K$_{1-x}$Rb$_x$Si$_2$, K$_{1-x}$Rb$_x$Ge$_2$, K$_{1-x}$RbSn$_2$, K$_{1-x}$Cs$_x$Si$_2$, K$_{1-x}$Cs$_x$Ge$_2$, K$_{1-x}$Cs$_x$Sn$_2$, Rb$_{1-x}$Cs$_x$Si$_2$, Rb$_{1-x}$Cs$_x$Ge$_2$, Rb$_{1-x}$Cs$_x$Sn$_2$, NaSi$_{1-y}$Ge$_y$, KSi$_{1-y}$G$_y$, RbSi$_{1-y}$Ge$_y$, CsSi$_{1-y}$Ge$_y$, Na$_{1-x}$K$_x$Si$_{1-y}$Ge$_y$, Na$_{1-x}$Rb$_x$Si$_{1-y}$Ge$_y$, Na$_{1-x}$Cs$_x$Si$_{1-y}$Ge$_y$, K$_{1-x}$Rb$_x$Si$_{1-y}$Ge$_y$, K$_{1-x}$Cs$_x$Si$_{1-y}$Ge$_y$, and Rb$_{1-x}$Cs$_x$Si$_{1-y}$Ge$_y$, (0<x, y<1), or any variation, combination, mixture, alloy, or solid solution of any of these compounds.

The primary reactant can be Na$_4$Si$_4$ and K$_4$Si$_4$. The secondary reactant can be positioned above and below the primary reactant and can be carbon, graphite and glass.

In another embodiment of the invention, a single crystal clathrate compound is disclosed comprising: a type II clathrate lattice with atoms of silicon as a main framework forming lattice spacings within the framework, wherein the clathrate lattice follows the general formula of Si$_y$, where y indicates the number of Si atoms in the main framework wherein y≦136; and guest atoms (A) to selectively occupy the lattice spacings of the clathrate lattice such that the clathrate lattice follows the general formula A$_x$Si$_y$, wherein 0<x<24. The guest atom can be an alkali metal or an alkali earth metal. Preferably y=136, the guest atom is potassium (K) and x=24.

In further embodiment of the invention, a reaction vessel is provided comprised of: a reaction die having a first and a second end; a channel having an inner surface that is positioned within the reaction die wherein the channel extends through the length of the reaction die from the first end of the reaction die to the second end of the reaction die; a first punch having a first end and a second end wherein the first end is positioned at the first end of the reaction die and is slidingly engagable into the channel; a second punch having a first end and a second end wherein the first end is positioned at the second end of the reaction die and is slidingly engagable into the channel; a first platens having a first end and a second end wherein the first end is in direct contact with the second end of the first punch; and a second platens having a first end and a second end wherein the first end is in direct contact with the second end of the second punch. Pressure is applied to the first and second platens to slidingly engage the first and second punches into the channel to facilitate mass transport in the primary reactant. The pressure applied can be uniaxial.

The reaction vessel can be further comprised of at least one bolt which extends through the reaction vessel from the second end of the first platens to the second end of the second platens. The at least one bolt can be tightened to exert uniaxial pressure on the platens. Preferably, there are at least two bolts with one bolt positioned on either side of the channel.

The reaction vessel can further be comprised of graphite foil lining the inner surface of the channel. The graphite foil can also be attached to the first end of the first and second punches so that when the reactants are placed in the channel, they are encapsulated within the graphite foil lining to prevent a reaction with the die as well as to facilitate removal of the products.

The reaction die can be constructed of a material such as stainless steel. The punches can be constructed of a material such as high density graphite.

BRIEF DESCRIPTION OF THE DRAWINGS

For a fuller understanding of the invention, reference should be made to the following detailed description, taken in connection with the accompanying drawings, in which:

FIG. 4 is a series of images of the crystal structures of (A) Na$_8$Si$_{46}$ and (B) Na$_{24}$Si$_{136}$ determined from single crystal X-ray diffraction refinements.

FIG. 5 is a table of the atomic coordinates and equivalent* isotropic atomic displacement parameters (Å$^2$) for Na$_8$Si$_{46}$.

FIG. 6 is a table of anisotropic atomic displacement parameters* (Å$^2$) for Na$_8$Si$_{46}$.

FIG. 7 is a table of bond lengths (Å) for Na$_8$Si$_{46}$.

FIG. 8 is a table of atomic coordinates and equivalent* isotropic atomic displacement parameters (Å$^2$) for Na$_{24}$Si$_{136}$.

FIG. 9 is a table of anisotropic atomic displacement parameters* (Å$^2$) for Na$_{24}$Si$_{136}$.

FIG. 10 is a table of bond lengths (Å) for Na$_{24}$Si$_{136}$.

DETAILED DESCRIPTION OF THE PREFERRED EMBODIMENT

Figure 1:
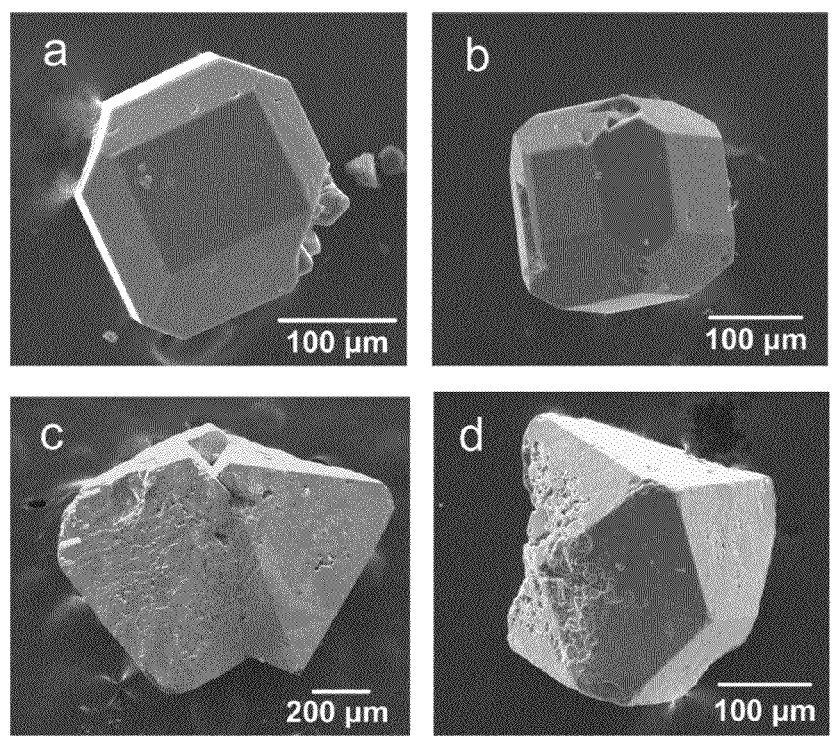
FIGS. 1A and 1B are images of scanning electron micrographs of Na$_8$Si$_{46}$ single crystals grown at 585° C.
FIGS. 1C and 1D are images of scanning electron micrographs of Na$_{24}$Si$_{136}$ single crystals grown at 665° C.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The use of the terms "about", "approximately" and/or "substantially" are not intended to limit the scope of the invention but instead encompass the specified material, parameter or step as well as those that do not materially affect the basic and novel characteristics of the invention.

A "primary reactant" is defined as a Zintl phase or precursor compound that is formed by reaction of the appropriate high purity elements in the proper mole ratios at appropriate temperatures in tungsten or tantalum containers. The reactants and crucible are sealed in a stainless steel or tantalum canister under high purity nitrogen or argon gas at a pressure of one atmosphere. The stainless steel or tantalum canister is itself sealed under nitrogen or argon at the pressure ⅔ of one atmosphere in a silica ampoule. If the resulting precursor compounds are sensitive to air and moisture all handling must be performed in an inert atmosphere. Some examples of such precursors include, but are not limited to NaSi, NaGe, NaSn, KSi, KGe, KSn, RbSi, RbGe, RbSn, CsSi, CsGe, CsSn, BaSi$_2$, BaGe$_2$, BaSn$_2$, SrSi$_2$, SrGe$_2$, SrSn$_2$, Na$_{1-x}$K$_x$Si$_2$, Na$_{1-x}$K$_x$Ge$_2$, Na$_{1-x}$K$_x$Sn$_2$, Na$_{1-x}$RbSi$_2$, Na$_{1-x}$RbGe$_2$, Na$_{1-x}$Rb$_x$Sn$_2$, Na$_{1-x}$Cs$_x$Si$_2$, Na$_{1-x}$Cs$_x$Ge$_2$, Na$_{1-x}$Cs$_x$Sn$_2$, K$_{1-x}$Rb$_x$Si$_2$, K$_{1-x}$Rb$_x$Ge$_2$, K$_{1-x}$Rb$_x$Sn$_2$, K$_{1-x}$Cs$_x$Si$_2$, K$_{1-x}$Cs$_x$Ge$_2$, K$_{1-x}$Cs$_x$Sn$_2$, Rb$_{1-x}$Cs$_x$Si$_2$, Rb$_{1-x}$Cs$_x$Ge$_2$, Rb$_{1-x}$Cs$_x$Sn$_2$, NaSi$_{1-y}$Ge$_y$, KSi$_{1-y}$G$_y$, RbSi$_{1-y}$Ge$_y$, CsSi$_{1-y}$Ge$_y$, Na$_{1-x}$K$_x$Si$_{1-y}$Ge$_y$, Na$_{1-x}$Rb$_x$Si$_{1-y}$Ge$_y$, Na$_{1-x}$Cs$_x$Si$_{1-y}$Ge$_y$, K$_{1-x}$Rb$_x$Si$_{1-y}$Ge$_y$, K$_{1-x}$Cs$_x$Si$_{1-y}$Ge$_y$, and Rb$_{1-x}$Cs$_x$Si$_{1-y}$Ge$_y$ (0<x, y<1), or any variation, combination, mixture, alloy, or solid solution of any of these or similar or related compounds. It is important to note that other precursor compounds not listed above may also be used, and should be considered within the scope of the invention as well if they are used in the manner described below. The words "precursor" and "primary reactant" are used interchangeably herein.

A "secondary reactant" is a compound capable of reducing the concentration of at least one chemical constituent of the primary reactant in a kinetically controlled reaction thereby altering the composition of the primary reactant. The secondary reactant is chosen based on the composition of the primary reactant and the desired reaction products. Examples of secondary reactants include, but are not limited to, graphite, carbon and glass.

A "diffusion-facilitating layer" is a layer of a compound that is positioned between the primary and secondary reactants to prevent adhesion of the secondary reactant to the primary reactant. This layer serves as an effective passive physical barrier to prevent direct solid-solid reactions between the primary and secondary reactants but allows diffusion of ions and/or vapor. The diffusion facilitating layer is preferably inert and porous and is capable of transmitting a high vapor pressure constituent but does not participate in chemical reaction with either the primary or the secondary reactant. The compound used in the layer can vary according to the specific primary and secondary reactants used. For example, dry NaCl can be used for the diffusion facilitating layer when the primary reactant is Na$_4$Si$_4$. Compounds that can be used in the diffusion-facilitating layer include, but are not limited to, LiCl, NaCl, KCl, RbCl, CsCl, and BaF.

A "chemical constituent" refers to at least one component of the primary reactant. The chemical constituent preferably possesses a high vapor pressure. As a fraction (i.e. partial pressure) of the chemical constituent is reduced in a controlled manner by the reaction with the secondary reactant, the chemical constituent is transported into the volume enclosed by the apparatus. The chemical constituent can be any chemical element used to comprise the primary reactant, including but not limited to the alkali metals and alkali earth metals, such as Na, K, Rb, Cs, Fr, Li, Ba, Sr and Ca.

"Phase pure" refers to phases of intermetallic clathrates being homogenous in their composition and crystalline structure. By homogenous, it is meant that the composition contains 100% of one type of crystalline structure. For example, a composition of Na$_8$Si$_{48}$ contains only Na$_8$Si$_{48}$ crystals and a composition of Na$_{24}$Si$_{136}$ contains only Na$_{24}$Si$_{136}$ crystals. There is no mixture of crystals in the phases.

"Framework" refers to covalently bonded atoms or molecules that form a backbone structure or polyhedra for type-I and type-II clathrates. The framework is comprised of large hollow polyhedral cages that are covalently connected into a three-dimensional rigid network or lattice. The lattice spacings or cages can surround guest atoms to form crystalline compounds with the stoichiometry of A$_x$E$_y$ in which A represents guest atoms contained within the cages and E represents the atoms that form the framework of the crystal structure. The terms framework and lattice are used interchangeably herein. The framework atoms can include, but are not limited to, semi-metal atoms and nonmetal atoms such as Si, Ge, Sn, P, Ga, Zn, Cd, In, As, Sb, and Te.

"Guest atoms" refer to atoms or molecules that are contained within lattice spacings or cages of the framework of type-I or type-II clathrates. The guest atoms can be, but are not limited to, alkali metals and alkali earth metals. Guest atoms can include, but are not limited to, at least one atom selected from the group consisting of Li, Na, K, Rb, Cs, Fr, Be, Mg, Ca, Sr, Ba, Ra, Sc, Y, La, Ce, Pr, Nd, Sm, Eu, Gd, Tb, Dy, Ho, Er, Tm, Yb, Lu, Ac, Th, Pa, U, Cu, Ag, Au, Zn, Cd, Hg, B, Al, Ga, In, Tl, Ti, Zr, Hf, Nb, Ta, Cr, Mo, W, Fe, Co, Ni, Ru, Rh, Pd, Os, Ir and Pt. The terms lattice spacings and cages are used interchangeably herein.

"Occupancy" refers to the number of guest atoms or molecules that are contained within the cages of the framework. The formula for any clathrate compound is determined in part by the ratio of available cages to the amount of framework.

The type-I and type-II clathrates are composed of a covalently bonded framework which forms a polyhedra capable of encapsulating atoms inside. The framework forms lattice spacings or cages which can be occupied by guest atoms. The crystal structure of the type-I clathrate consists of structural units having the general formula $A_xE_{46}$ ($0 \leq x \leq 8$) in which E represents the atoms that form the framework of the structure and A represents the guest atoms that are contained inside the framework polyhedral. The crystal structure of the type-II clathrates consists of structural units having the general formula $A_xE_{136}$ ($0 \leq x \leq 24$) in which E represents the atoms that form the framework of the structure and A represents the guest atoms that are contained inside the framework polyhedral.

The development of novel synthetic routes for preparing intermetallic clathrates is motivated by the unconventional structure-property relationships these materials display and potential for solid state energy conversion applications. (H. Kawaji, H.-O. Horie, S. Yamanaka, M. Ishikawa, *Phys. Rev. Lett.* 1995, 74, 1427-1429; J. L. Cohn, G. S. Nolas, V. Fessatidis, T. H. Metcalf, G. A. Slack, *Phys. Rev. Lett.* 1999, 82, 779-782; R. P. Hermann, V. Keppens, P. Bonville, G. S. Nolas, F. Grandjean, G. J. Long, H. M. Christen, B. C. Chakoumakos, B. C. Sales, and D. Mandrus, *Phys. Rev. Lett.,* 2006, 97, 017401-1—017401-4; G. S. Nolas, J. L. Cohn, G. A. Slack, S. B. Schujman, *Appl. Phys. Lett.* 1998, 73, 178-180; b) X. Shi, J. Yang, S. Bai, J. Yang, H. Wang, M. Chi, J. R. Salvador, W. Zhang, L. Chen, W. Wong-Ng, *Adv. Func. Mater.* 2010, 20, 755-763.)

Chemical oxidation, spark plasma treatment, high-temperature/high-pressure, and other approaches utilizing appropriate crystalline precursors have emerged as effective synthetic tools for preparing novel stable and metastable compositions otherwise inaccessible by more conventional solid state synthesis or crystal growth techniques. (A. M. Guloy, R. Ramlau, Z. Tang, W. Schnelle, M. Baitinger, Yu. Grin, *Nature,* 2006, 443, 320-323; B. Böhme, A. Guloy, Z. Tang, W. Schnelle, U. Burkhardt, M. Baitinger, Yu. Grin, *J. Am. Chem. Soc.,* 2007, 129, 5348-5349; D. Neiner, N. L. Okamoto, C. L. Condron, Q. M. Ramasse, P. Yu, N. D. Browning, S. M. Kauzlarich, *J. Am. Chem. Soc.* 2007, 129, 13857-13862; M. Beekman, M. Baitinger, H. Borrmann, W. Schnelle, K. Meier, G. S. Nolas, Yu. Grin, *J. Am. Chem. Soc.* 2009, 131, 9642-9643; A. San-Miguel, P. Toulemonde, *High Press. Res.,* 2005, 25, 159-185; b) A. Wosylus, I. Veremchuk, W. Schnelle, M. Baitinger, U. Schwarz, Yu. Grin, *Chem. Eur. J.,* 2009, 15, 5901-5903; A. Kalzoglou, S. Ponou, T. F. Fässler, *Eur. J. Inorg. Chem.,* 2008, 4507-4510.)

Whereas single crystals are readily grown using established techniques or flux synthesis for some representatives, crystal growth of many intermetallic clathrate compositions can be challenging; in such cases the identification of effective and easily implemented methods for crystal growth are prerequisite to gaining a better understanding of their intriguing structural and physical properties. (B. C. Sales, B. C. Chakoumakos, R. Jin, J. R. Thompson, D. Mandrus, *Phys. Rev. B,* 2001, 63, 245113-1-245113-8; M. Christensen, A. B. Abrahamsen, N. B. Christensen, F. Juranyi, N. H. Andersen, K. Lefmann, J. Andreasson, C. R. H. Bahl, B. B. Iversen, *Nature Mater.,* 2008, 7, 811-815; C. L. Condron, J. Martin, G. S. Nolas, P. M. B. Piccoli, A. J. Schultz, S. M. Kauzlarich, *Inorg. Chem.,* 2006, 45, 9381-9386; T. Tanaka, T. Onimaru, K. Suekuni, S. Mano, H. Fukuoka, S. Yamanaka, T. Takabatake, *Phys. Rev. B,* 2010, 81, 165110-1-165110-6; M. Beekman, G. S. Nolas, *J. Mater. Chem.,* 2008, 18, 842-851.)

The inventors have developed a straightforward and accessible approach for selective single-crystal growth of clathrate-I and clathrate-II intermetallic clathrates. As an example, the inventors achieved single crystal growth of clathrate-I $Na_8Si_{46}$ and clathrate-II $Na_{24}Si_{136}$. The crystal growth of $Na_8Si_{46}$ and $Na_{24}Si_{136}$ are used as examples of intermetallic single crystal growth that can be achieved by the method presented herein and are not meant to be limiting in any way. The method is applicable to the formation of single crystals for any clathrate-I or clathrate-II structure. While the relative chemical simplicity of these prototypical intermetallic clathrates is ideal for understanding clathrate structure-property relationships, synthesis in the binary Na—Si system has historically been complicated by the simultaneous formation of the two different structure types (clathrate-I and clathrate-II), which are characterized by nearly identical compositions. (J. S. Kasper, P. Hagenmuller, M. Pouchard, C. Cros, *Science,* 1965, 150, 1713; J. S. Tse, K. Uehara, R. Rousseau, A. Ker, C. I. Ratcliffe, M. A. White, G. MacKay, *Phys. Rev. Lett.,* 2000, 85, 114-117; M. Beekman, W. Schnelle, H. Borrmann, M. Baitinger, Yu. Grin, G. S. Nolas, *Phys. Rev. Lett.* 2010, 104, 018301-1-018301-4.)

Typically prepared only in microcrystalline form by thermal decomposition of $Na_4Si_4$ under vacuum or argon atmosphere, achieving a homogenous product of either phase remains non-trivial. (J. S. Kasper, P. Hagenmuller, M. Pouchard, C. Cros, *Science,* 1965, 150, 1713; C. Cros, M. Pouchard, P. Hagenmuller, *J. Solid State Chem.* 1970, 2, 570) E. Reny, P. Gravereau, C. Cros, M. Pouchard, *J. Mater. Chem.* 1998, 8, 2839; G. K. Ramachandran, J. J. Dong, J. Diefenbacher, J. Gryko, R. F. Marzke, O. F. Sankey, P. F. McMillan, *J. Solid State Chem.* 1999, 145, 716; H. Horie, T. Kikudome, K. Teramura, S. Yamanaka, *J. Solid State Chem.* 2009, 182, 129.)

A rational method for selective, phase pure crystal growth has not yet been proposed. Very recently, $Na_{24}Si_{136}$ single crystals were prepared by spark plasma treatment of $Na_4Si_4$. (M. Beekman, M. Baitinger, H. Borrmann, W. Schnelle, K. Meier, G. S. Nolas, Yu. Grin, *J. Am. Chem. Soc.* 2009, 131, 9642-9643.) Here, the inventors demonstrate that selective, phase pure, single-crystal growth of both $Na_8Si_{46}$ and $Na_{24}Si_{136}$ (FIG. 1) can be achieved by simply maintaining sufficient Na partial pressures during slow, controlled deprivation of Na from the precursor $Na_4Si_4$. The approach can access regions of the equilibrium diagram that can be otherwise difficult to reach in such systems.

The approach the inventors have chosen was guided by several considerations: (i) As a result of the high vapour pressure of Na over the compound, thermal decomposition of the precursor $Na_4Si_4$ under dynamic vacuum or inert atmosphere in open vessels occurs at relatively low temperatures (350° C. to 450° C., depending on vessel and environment), resulting in microcrystalline products. (C. Cros, M. Pouchard, P. Hagenmuller, *J. Solid State Chem.* 1970, 2, 570; E. Reny, P. Gravereau, C. Cros, M. Pouchard, *J. Mater. Chem.* 1998, 8, 2839; G. K. Ramachandran, J. J. Dong, J. Diefenbacher, J. Gryko, R. F. Marzke, O. F. Sankey, P. F. McMillan, *J. Solid State Chem.* 1999, 145, 716; H. Horie, T. Kikudome, K. Teramura, S. Yamanaka, *J. Solid State Chem.* 2009, 182, 129.) (ii) $Na_4Si_4$ is stable (with respect to decomposition) under sufficient Na partial pressure in closed (i.e., sealed) vessels, and melts congruently at 800° C. (H. Morito, T. Yamada, T. Ikeda, H. Yamane, *J. Alloys Comp.* 2009, 480, 723-726.) (iii) Since the clathrate products are deficient in Na relative to $Na_4Si_4$ (which, as noted above, is a line compound), nucleation and growth of both $Na_8Si_{46}$ and $Na_{24}Si_{136}$ will require a slow but continuous shift toward the Si-rich composition, and mass transport must take place. In light of these considerations, maintaining a relatively high partial pressure of Na and adequate mass transport facilitated upon crystal nucleation as the composition of the $Na_4Si_4$ precursor is continuously changed, growth of single crystals can be achieved.

Briefly, the approach utilizes a primary reactant which is placed into an appropriate reaction vessel or apparatus. The apparatus is contained within an appropriate furnace chamber allowing temperature control and an appropriate atmosphere, including, but not limited to, high vacuum, inert gas (argon, nitrogen, etc.), or reducing atmosphere (partial $H_2$, etc.). This facilitates the controlled reaction with a secondary reactant, which is spatially separated from the primary reactant. The invention involves the chemical reaction of one or more constituents, which possess a high vapor pressure, such as an alkali metal. The reaction occurs between the primary reactant and the secondary reactant, which is thus chosen appropriately depending upon the primary reactant and the desired reaction products, in a controlled manner. As the fraction (i.e. partial pressure) of the high vapor pressure constituent is reduced in a controlled manner due to a kinetically controlled reaction with the secondary reactant, this constituent is transported from the primary reactant into the volume enclosed by the apparatus, thereby altering the chemical composition of the primary reactant. This transport allows the composition of the primary reactant to be altered in a controlled manner, with a high partial pressure of the necessary constituent needed for the crystal growth of the desired product. Crystal growth of the desired product is facilitated by controlled alteration of the chemical composition of the precursor and constituent partial pressure conditions that are needed. The primary reactant can be an alkali metal or an alkali earth metal. The primary reactant can be reduced by chemical means or by evaporation so that single phase pure crystals are formed with less than 100% alkali metal or alkali earth metal occupancy within the crystal structure. For example, $Na_xSi_{136}$ and $K_xSi_{136}$, where $0 \leq x \leq 24$.

Specifically, using an example where $Na_4Si_4$ is the primary reactant, Na is slowly removed from the $Na_4Si_4$ precursor by reaction of Na vapor with spatially separated graphite, in a closed volume under uniaxial pressure. A custom reaction vessel comprising a simple punch and die design was constructed, such that uniaxial pressure can be applied to the specimen while heated in a tube furnace. The $Na_4Si_4$ precursor was finely ground under dry nitrogen atmosphere and loaded into a stainless steel die assembly, along with high purity graphite flake loaded above and below the $Na_4Si_4$ precursor. To prevent the adhesion between graphite and clathrate crystals, which occurred on first attempts, a 1 mm thick layer of dry NaCl was introduced between the $Na_4Si_4$ precursor and graphite. The NaCl layer served as an effective passive physical barrier to direct reaction between graphite and $Na_4Si_4$, but allowed diffusive exchange of Na. This C—NaCl—$Na_4Si_4$—NaCl—C "sandwich" was encapsulated on all sides by graphite foil to impede the escape of Na vapor, then compressed and clamped under 115 MPa uniaxial pressure at room temperature. The entire assembly was introduced into a fused silica ampoule, coupled to a vacuum system, evacuated to $10^{-6}$ torr, and heated at the desired reaction temperature under dynamic vacuum.

As shown in FIG. 1, single crystal growth of the $Na_8Si_{46}$ and $N_{24}Si_{136}$ compositions is achieved. Energy dispersive X-ray spectroscopy found only Na and Si to be present in the crystals. Cubic $Na_8Si_{46}$ crystals are repeatedly observed to form as truncated cubes, whereas $Na_{24}Si_{136}$ formed with pyramidal habit. Twinned crystals as shown in FIG. 1d were also observed for $Na_{24}Si_{136}$, but not for $Na_8Si_{46}$. These observations are in agreement with high resolution transmission electron microscopy studies on microcrystalline $Na_xSi_{136}$ (x<24) and $Na_8Si_{46}$ specimens obtained from thermal decomposition of $Na_4Si_4$. In spite of the propensity for twining in the clathrate-II system, relatively large single crystals of $Na_{24}Si_{136}$ are obtained.

Figure 2:
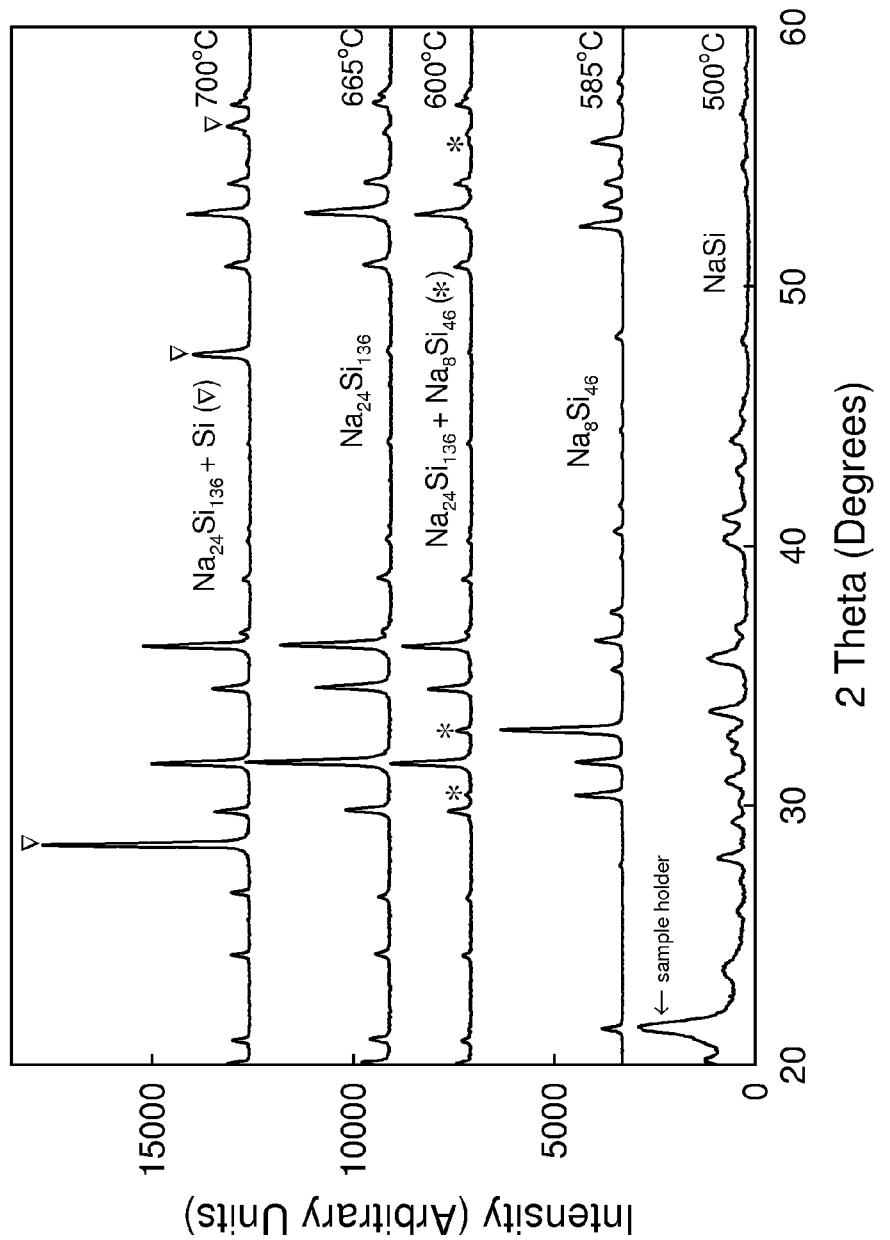
FIG. 2 is a graph depicting the formation of different phases at different temperatures starting from the primary reactant of Na$_4$Si$_4$.

The effects of temperature and time on the reaction products were studied as shown in FIG. 2 and established that selectivity in growth of $Na_8Si_{46}$ or $Na_{24}Si_{136}$ is accomplished by merely changing the reaction temperature. For reactions run at 600° C. for 8 hours, the formation of either clathrate phase was not observed. Between 580° C. and 590° C., clathrate-I $Na_8Si_{46}$ was found to exclusively form, whereas between 660° C. and 670° C. crystal growth of clathrate-II $Na_{24}Si_{136}$ occurred instead.

For the experiments conducted to determine the effects of temperature and time on the reaction products, the starting material was the Zintl Phase $Na_4Si_4$ which was annealed at different temperatures and pressures, for various times. The approach was to hold the pressure constant and vary the annealing temperature and time. FIG. 2 shows details on the dependence of temperature in the formation of single crystals of $Na_8Si_{46}$ and $Na_{24}Si_{136}$. In all cases the annealing time was 8 hrs. Annealing $Na_4Si_4$ at 585° C. results in a formation of single crystals of $Na_8Si_{46}$ with the purity of the product material confirmed by X-ray analysis on powdered specimens. When the annealing temperature was increased to 600° C., peaks (indicated by * in FIG. 2) of the type-II $Na_{24}Si_{136}$ phase started appearing. This indicates that at higher temperatures the type-II phase is the more stable phase. Indeed, at temperatures of 665° C. it was found that only crystals of $Na_{24}Si_{136}$ form. The purity of the product material was confirmed by X-ray analysis on powdered specimens. No peaks due to $Na_8Si_{46}$ were observed in the XRD spectrum, which has been a problem in synthesizing the type-II $Na_{24}Si_{136}$ clathrate. (C. Cross, M. Pouchard, P. Hagenmuller, and J. S. Kasper, *Bull. Soc. Chim. France*, 2737 (1968).) Annealing at 700° C. leads to the decomposition of the type-II phase to elemental Si (the respective Si peaks in the XRD spectrum are indicated by V in FIG. 2).

Another set of experiments was performed to analyze the formation of different phases for different times, resulting in different yield of the product material, with the respective phases still being observed at the appropriate temperatures according to FIG. 2. The highest yield (8.5% and 6% for $Na_8Si_{46}$ and $Na_{24}Si_{136}$, respectively) was achieved at approximately 8 hours, with longer times giving smaller yield, and eventually after annealing the precursor for more than 24 hours the clathrates decompose to elemental Si.

Figure 3:
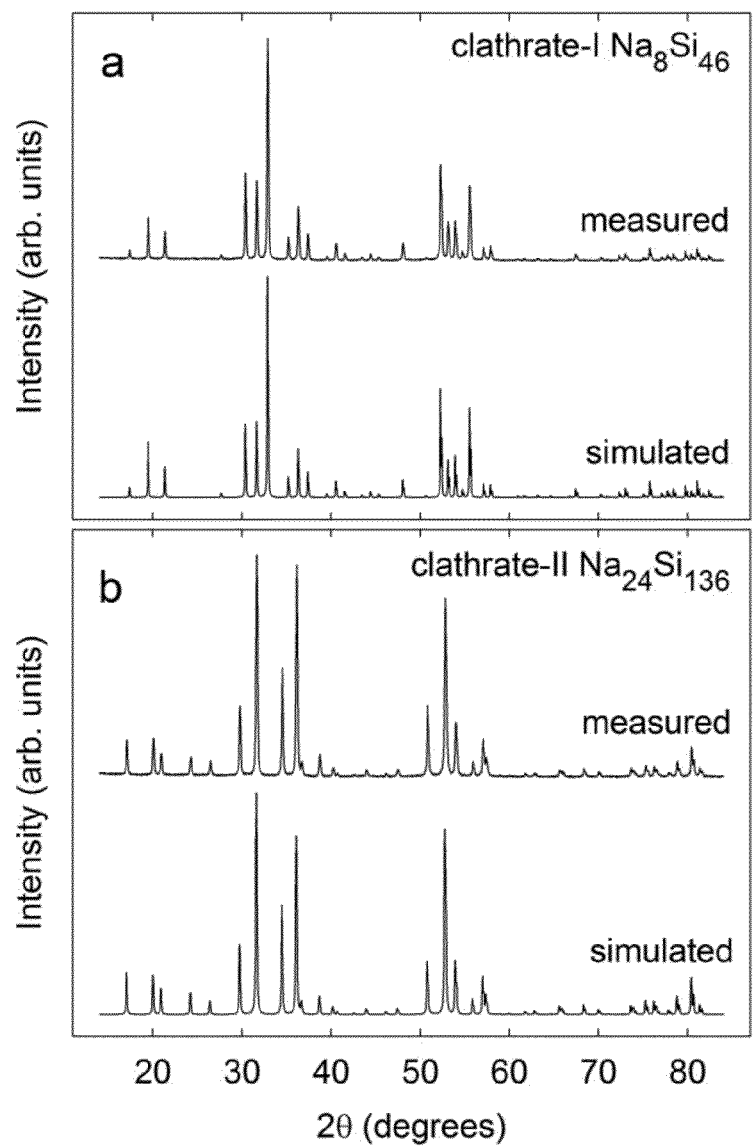
FIG. 3 is a series of graphs depicting the measured and simulated powder X-ray diffraction patterns for (A) Na$_8$Si$_{46}$ and (B) Na$_{24}$Si$_{136}$ prepared at 585° C. and 665° C. respectively, collected from crushed single crystal specimens. No impurity phases were detected.
Figure 11:
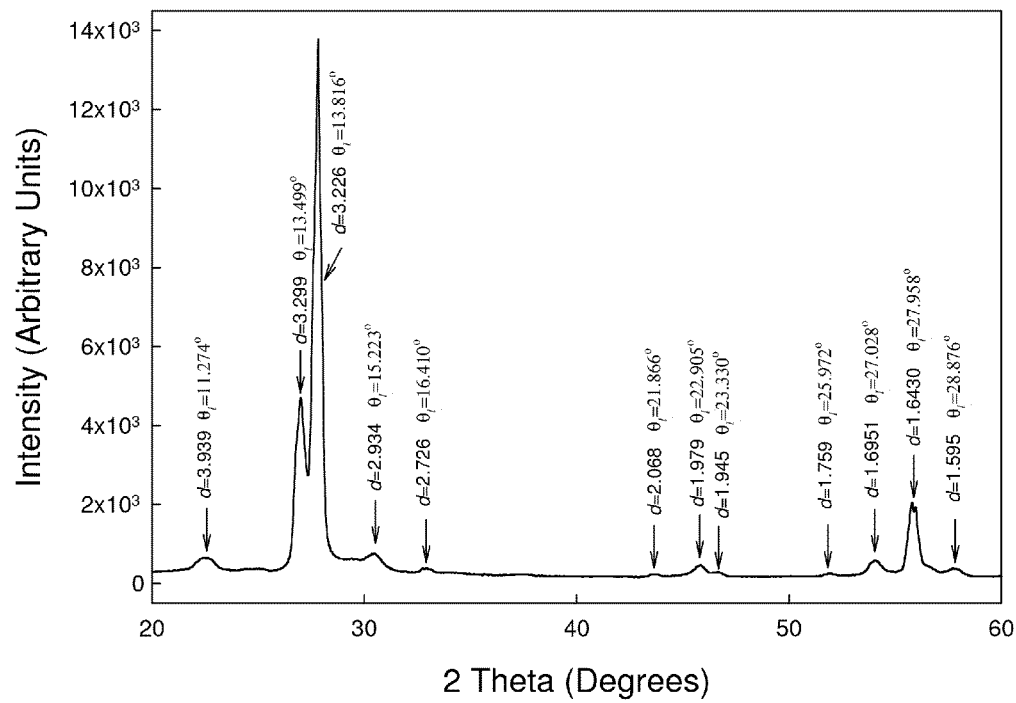
FIG. 11 is as graph depicting the XRD-pattern for intercalated graphite showing the reflections from the (00l) planes. The powder X-ray diffractogram of the graphite flake recovered after the reaction shows that all the reflections are from the (00l) planes which confirmed the presence of a mixture of stages of Na intercalated graphite.

Elucidated by the powder X-ray diffraction (XRD) patterns shown in FIG. 3, phase pure $Na_{24}Si_{136}$ and $Na_8Si_{46}$ specimens are synthesized at 665° C. and 585° C., respectively. Simulated powder XRD patterns, based on the respective refined crystal structures obtained from single crystal XRD (vide infra), are shown for reference. Preliminary magic angle spinning (MAS) [23] Na nuclear magnetic resonance data (not shown) corroborates the phase purity of the products by the absence of chemical shifts in the spectra originating from the other corresponding clathrate phase. The phase purity of the specimens illustrates the effectiveness of the method for selective preparation of the desired clathrate-I or clathrate-II phase, respectively, which has traditionally been highly challenging using the known synthetic routes. Moreover, this identifies the first method for selective crystal growth of Na—Si clathrate-I and clathrate-II, respectively.

The crystal structures of $Na_8Si_{46}$ and $Na_{24}Si_{136}$ were accurately refined by single crystal X-ray diffraction studies, which also further confirmed the identity and phase purity of the single crystals. The resulting refined crystal structures are depicted in FIG. 4. In both structures, the silicon framework is characterized by three crystallographically independent Si atoms, which form two different coordination cages for the Na guests: $Si_{20}$ and $Si_{24}$ in $Na_8Si_{46}$, and $Si_{20}$ and $Si_{28}$ in $Na_{24}Si_{136}$. Refinement data and results are tabulated in FIGS. 5-11. The single-crystal structure refinement for $Na_8Si_{46}$ is reported here for the first time. The refined atomic positions for $Na_{24}Si_{136}$ showed excellent agreement (within 2σ) with those obtained from $Na_{24}Si_{136}$ single crystals grown by spark plasma treatment. (M. Beekman, M. Baitinger, H. Borrmann, W. Schnelle, K. Meier, G. S. Nolas, Yu. Grin, *J. Am. Chem. Soc.* 2009, 131, 9642-9643.)

In both phases, full occupation of all Si framework sites was observed, and both cages in the two clathrate structures were found to be fully occupied by the Na guests confirming the stoichiometric composition. Substantial disorder is observed for the guest $Na@Si_{28}$ in $Na_{24}Si_{136}$, in agreement with a rattling phonon mode and off-centering associated with this guest. (M. Beekman, M. Baitinger, H. Borrmann, W. Schnelle, K. Meier, G. S. Nolas, Yu. Grin, *J. Am. Chem. Soc.* 2009, 131, 9642-9643; M. Beekman, W. Schnelle, H. Borrmann, M. Baitinger, Yu. Grin, G. S. Nolas, *Phys. Rev. Lett.* 2010, 104, 018301-1-018301-4; F. Brunet, P. Mélinon, A. San-Miguel, P. Kéghélian, A. Perez, A. M. Flank, E. Reny, C. Cros, M. Pouchard, *Phys. Rev. B,* 2000, 61, 16550.) Similar disorder for $Na@Si_{20}$ in $Na_{24}Si_{136}$ and $Na@Si_{20}$ and $Na@Si_{24}$ in $Na_8Si_{46}$ was not observed, and can be understood in terms of the relative sizes of guest and cage.

The available Na—Si equilibrium diagram describes a eutectic between $Na_4Si_4$ and Si and the absence of the clathrate phases, the ability to grow relatively large single crystals of both $Na_8Si_{46}$ and $Na_{24}Si_{136}$ indicates that these compounds are thermodynamically stable phases under the growth conditions employed. (H. Morito, T. Yamada, T. Ikeda, H. Yamane, *J. Alloys Comp.* 2009, 480, 723-726.) Na vapor, the source of which is the $Na_4Si_4$ precursor, reacts with the spatially separated graphite forming the intercalation compound. Powder X-ray diffraction (FIG. 11) of the graphite flake recovered after the reaction confirmed the presence of a mixture of stages of Na intercalated graphite. The vapor pressure of Na over the intercalated graphite is less than that over $Na_4Si_4$, such that the intercalation of the graphite results in further release of Na from the precursor or primary reactant in order to maintain local Na—$Na_4Si_4$ equilibrium (le Chatlier's principle). This continuously drives the composition Si rich. Nucleation of the respective clathrate phase ensues as the Na content of the sintered body is reduced, and the applied uniaxial pressure facilitates mass transport between precursor and growing crystal. The Na vapor pressure over the clathrate phases is expected to be lower than over the intercalation compound and $Na_4Si_4$ precursor. Regions of the equilibrium diagram are accessed that are otherwise difficult to reach due to the difficulty in controlling composition during nucleation and growth, by maintaining relatively high alkali metal partial pressures to avoid decomposition of both precursor and clathrate product.

The inventors have described here a single, straightforward method for the selective single-crystal growth of the intermetallic clathrates $Na_8Si_{46}$ and $Na_{24}Si_{136}$, by slow Na deprivation from bulk $Na_4Si_4$. Other techniques (e.g. controlled mechanical Na deprivation in the vapor phase, as opposed to chemical) are also effective if mass transport is achieved in the precursor to allow nucleation and growth of the target phase. The application of this or similar approaches to explore the preparation of intriguing elemental structures that have very recently been prepared from precursors such as $Na_4Si_4$ is also of interest. (H. Morito, H. Yamane, *Angew. Chem. Int. Ed.* 2010, 49, 3638-3641.)

A second example of the method was applied to the treatment of $K_4Si_4$ precursors, using similar conditions to those described above. Crystal growth of the clathrate-I phase $K_8Si_{46}$ and the clathrate-II phase $K_{24}Si_{136}$ was successfully achieved. Thus, the method of crystal growth described herein can be applied for the crystal growth of a broader range of materials, and reveals a new preparative tool for the crystal growth and synthesis of materials where conventional growth methods are unsuccessful.

Materials and Methods

Na metal (99.95%) and Si lump (99.9999%) were used as purchased from Alfa Aesar. Surface contamination of the Na metal was removed with a scalpel in a dry, purified $N_2$ glovebox. Si was also ground under $N_2$ to promote reaction. Crystalline $Na_4Si_4$ was prepared by direct reaction of elemental Na and Si in the Na:Si mass ratio 1.1:1 under $N_2$ in sealed stainless steel vessels at 650° C. for 36 hours. Before use for clathrate crystal growth, NaCl powder (99.99%) and graphite flake (99.9%) were dried by heating at 300° C.

Single-crystal X-ray diffraction intensity data for both $Na_8Si_{46}$ and $Na_{24}Si_{136}$ were collected at 200(2) K on a three-circle diffractometer system equipped with Bruker Smart Apex II CCD area detector using a graphite monochromator and a MoKα fine-focus sealed tube (λ=0.71073 Å). Structure refinement for $Na_8Si_{46}$: $R_1$=0.0110 for I>2σ(I) and $wR_2$=0.0254 for all data; GOF=1.000, largest peak: 0.215 $e^-/Å^3$; largest hole: −0.120 $e^-/Å^3$; Calculated density: 2.312 g/cm³. Structure refinement for $Na_{24}Si_{136}$: $R_1$=0.0115 for I>2σ(I) and $wR_2$=0.0290 for all data; GOF=1.000; largest peak: 0.203 $e^-/Å^3$; largest hole: −0.122 $e^-/Å^3$; Calculated density: 2.280 g/cm³

Powder X-ray diffraction patterns were collected with a Bruker D8 Focus diffractometer in Bragg-Brentano geometry using Cu Kα radiation. Scanning electron micrographs (SEM) were collected using a JEOL JSM-6390LV, and energy dispersive spectroscopy (EDS) data were collected using an Oxford INCA X-Sight 7582M. The EDS analysis revealed a stoichiometry of $Na_{6.8(1.2)}Si_{46}$ and $Na_{23.1(1.1)}Si_{136}$ for clathrate-I and clathrate-II crystals, respectively.

Single-Crystal X-Ray Diffraction Data and Refinement Results

A black prism of $Na_8Si_{46}$, approximate dimensions 0.18× 0.20×0.20 mm³, was used for the X-ray crystallographic analysis. The X-ray intensity data were measured at 200(2) K on a three-circle diffractometer system equipped with Bruker Smart Apex II CCD area detector using a graphite monochromator and a MoKα fine-focus sealed tube (λ=0.71073 Å). The detector was placed at a distance of 5.000 cm from the crystal.

A total of 1280 frames were collected with a scan width of 0.30° in ω and an exposure time of 8 sec/frame using Apex2 (Bruker, 2005). The total data collection time was 5.0 hours. The frames were integrated with Apex2 software package using a narrow-frame integration algorithm. The integration of the data using a Cubic unit cell yielded a total of 7652 reflections to a maximum θ angle of 29.93°, of which 305 were independent (completeness=100.0%, $R_{int}$=1.48%, $R_{sig}$=0.46%) and 303 were greater than 2σ(I). The final cell dimensions of a=10.1973(1) Å, b=10.1973(1) Å, c=10.1973 (1) Å, α=90°, β=90°, γ=90°, V=1060.366(18) Å³, are based upon the refinement of the XYZ-centroids of 6336 reflections with 2.8<θ<32.2° using Apex2. Analysis of the data showed 0% decay during data collection. Data were corrected for absorption effects with the Semi-empirical from equivalents method using SADABS (Sheldrick, 1996). The minimum and maximum transmission coefficients were 0.698 and 0.773.

The structure was solved and refined using the SHELXS-97 (Sheldrick, 1990) and SHELXL-97 (Sheldrick, 1997) software in the space group Pm-3n with Z=2 for the formula unit $Na_4Si_{23}$. The final anisotropic full-matrix least-squares refinement on $F^2$ with 16 variables converged at $R_1$=1.10% for the observed data and $wR_2$=2.54% for all data. The goodness-of-fit was 1.000. The largest peak on the final difference map was 0.215 $e^-/Å^3$ and the largest hole was −0.120 $e^-Å^3$. On the basis of the final model, the calculated density was 2.312 g/cm$^3$ and F(000), 732 $e^-$.

For the $Na_{24}Si_{136}$, a black prism with approximate dimensions 0.13×0.22×0.27 mm$^3$, was used for the X-ray crystallographic analysis. The X-ray intensity data were measured at 200(2) K on a three-circle diffractometer system equipped with Bruker Smart Apex II CCD area detector using a graphite monochromator and a MoKα fine-focus sealed tube (λ=0.71073 Å). The detector was placed at a distance of 5.000 cm from the crystal. A total of 3030 frames were collected with a scan width of −0.30° in ω and an exposure time of 12 sec/frame using Apex2 (Bruker, 2005). The total data collection time was 15.00 hours. The frames were integrated with Apex2 software package using a narrow-frame integration algorithm. The integration of the data using a Cubic unit cell yielded a total of 12553 reflections to a maximum θ angle of 29.98°, of which 262 were independent (completeness=100.0%, $R_{int}$=1.83%, $R_{sig}$=0.40%) and 260 were greater than 2σ(I). The final cell dimensions of a=14.7121(1) Å, b=14.7121(1) Å, c=14.7121(1) Å, α=90°, β=90°, γ=90°, V=3184.37(4) Å$^3$, are based upon the refinement of the XYZ-centroids of 11765 reflections with 2.4<θ<32.4° using Apex2. Analysis of the data showed 0% decay during data collection. Data were corrected for absorption effects with the Semi-empirical from equivalents method using SADABS (Sheldrick, 1996). The minimum and maximum transmission coefficients were 0.746 and 0.832.

The structure was solved and refined using the SHELXS-97 (Sheldrick, 1990) and SHELXL-97 (Sheldrick, 1997) software in the space group Fd3m with Z=8 for the formula unit $Na_3Si_{17}$. The final anisotropic full-matrix least-squares refinement on $F^2$ with 18 variables converged at $R_1$=1.15% for the observed data and $wR_2$=2.90% for all data. The goodness-of-fit was 1.000. The largest peak on the final difference map was 0.203 $\bar{e}/Å^3$ and the largest hole was −0.122 $\bar{e}/Å^3$. On the basis of the final model, the calculated density was 2.280 g/cm$^3$ and F(000), 2168 $\bar{e}$. The details of the single crystal refinement are given in FIGS. 5-10.

Figure 12A:
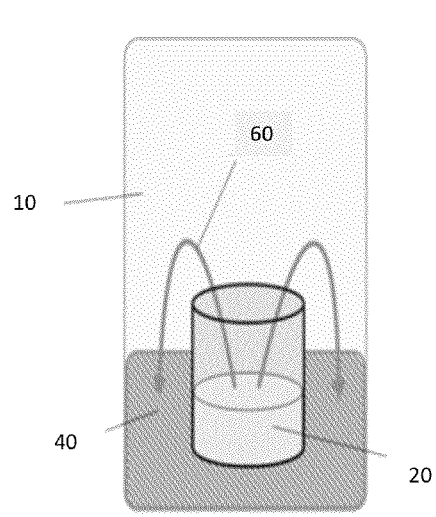
FIGS. 12A and 12B are images depicting possible reaction apparatuses that can be used in the production of the crystals.
Figure 12B:
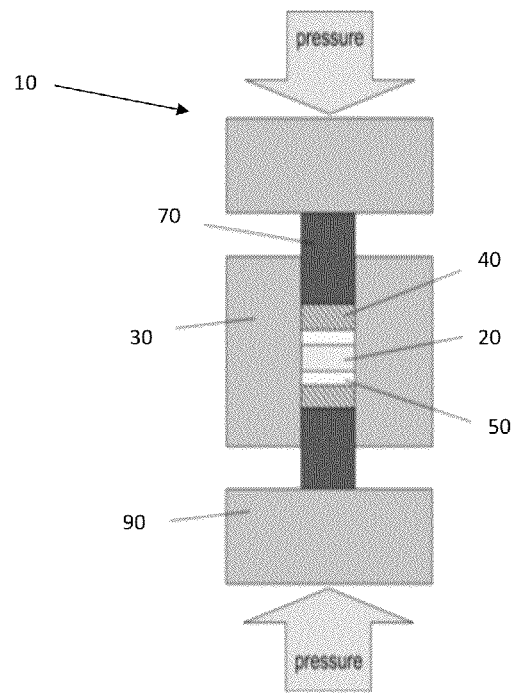
Figure 13A:
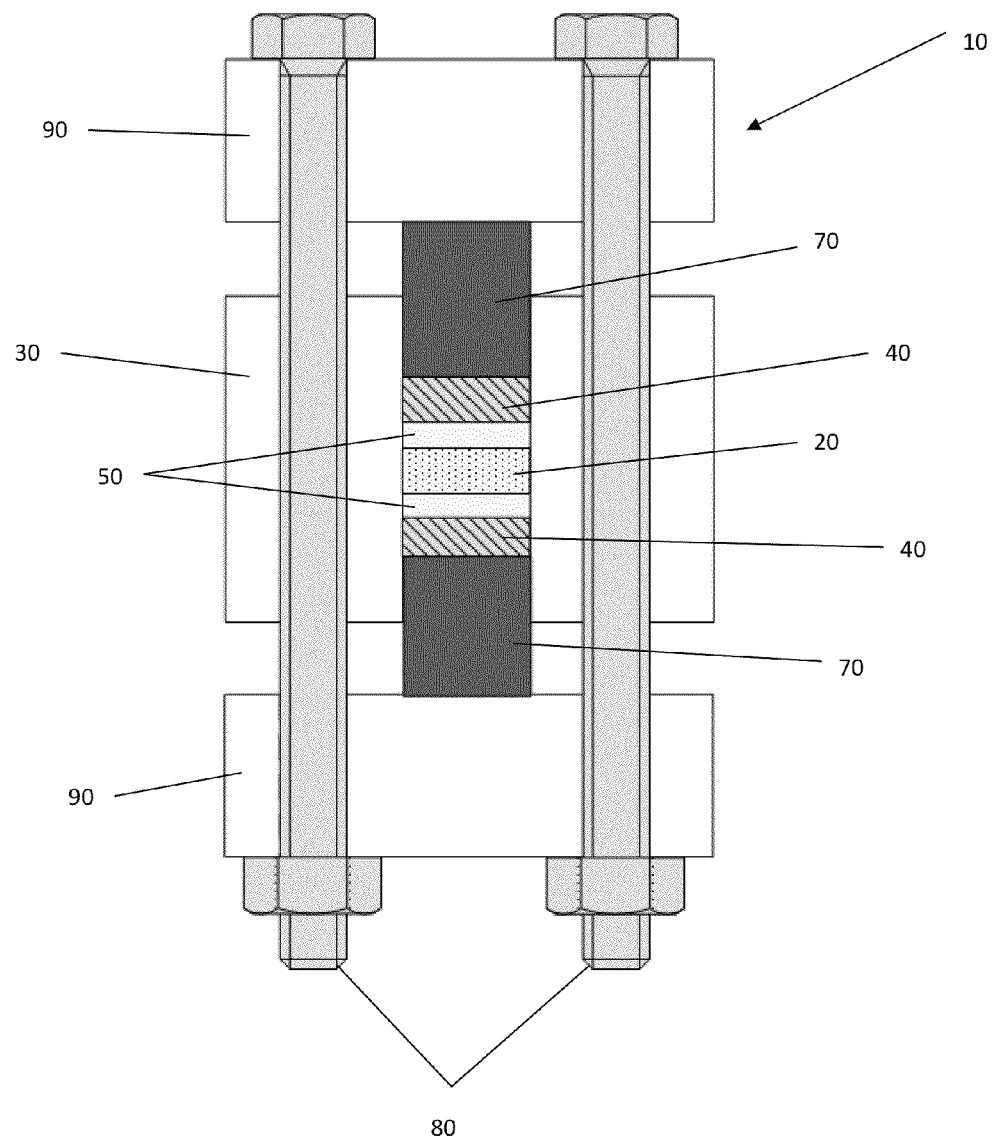
FIG. 13A is an image of the reaction apparatus constructed for use in the crystal growth of Na$_{24}$Si$_{136}$.

FIGS. 12A, 12B and 13A represent examples of reaction apparatuses that can facilitate the invention. The reaction vessel 10 can be a sealed container and is not limited to these examples. Any configuration of the apparatus which achieves the same goal is within the scope of the invention. Using the apparatus of FIG. 13A, the primary reactant 20 is ground or milled to a fine powder and positioned inside the reaction die 30. If needed, in order to control kinetics and also to preclude direct reaction between the primary 20 and secondary reactants 40, an inert porous or diffusion facilitating separation layer 50 may be included as shown, which transmits the high vapor pressure constituent 60 but does not participate in chemical reaction with either the primary 20 or secondary reactants 40. The secondary reactant 40 can be positioned above and below the primary reactant 20. Pressure is applied to the punches 70 and therefore the reactants, in order to facilitate mass transport in the primary reactant 20 that is needed for crystal growth. Standard techniques used in industry can be utilized for this purpose, such as conventional hot-pressing.

Figure 13B:
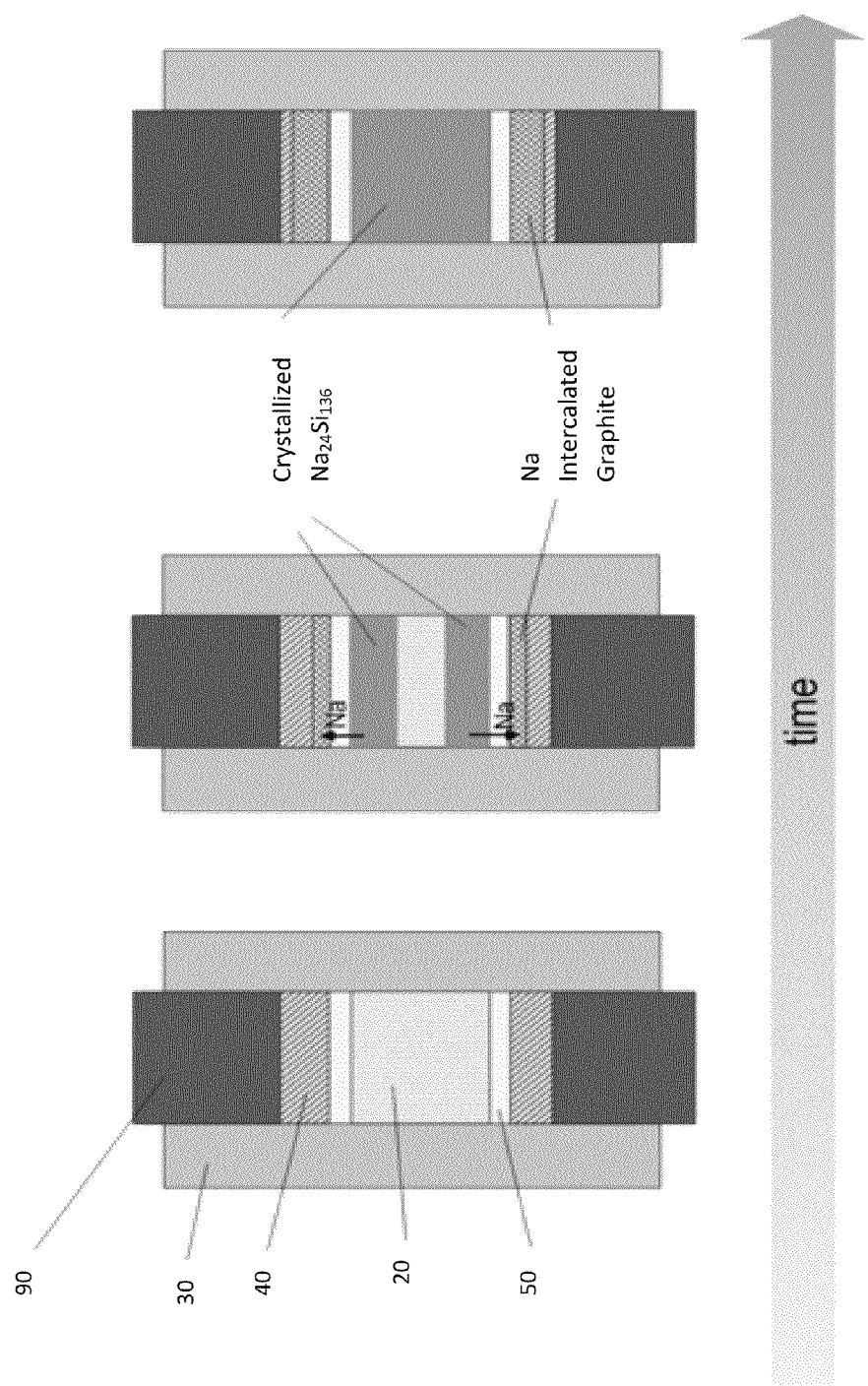
FIG. 13B is a schematic illustrating the process of crystal growth for Na$_{24}$Si$_{136}$.

A schematic of the crystal growth of the $Na_{24}Si_{136}$ intermetallic clathrate is disclosed in FIG. 13B. $Na_4Si_4$ was chosen as the primary reactant (precursor) 20, and pristine graphite flake (99.999% pure) was chosen as the secondary reactant 40. The precursor $Na_4Si_4$ was formed by direct reaction of the high purity elements at 650° C., as described previously. The $Na_4Si_4$ was then ground to a fine powder inside an inert atmosphere glove box. 200 mg of $Na_4Si_4$ powdered precursor was loaded into the custom designed reaction apparatus shown in FIG. 13A. The die 30 was constructed of stainless steel. The punches 70 were constructed of high density graphite. A thin (<1 mm) layer of NaCl was used as a separation layer 50 in between the $Na_4Si_4$ and graphite, which eliminated adhesion of graphite to the final $Na_{24}Si_{136}$ product. 100 mg of graphite were added above and below the NaCl separation layers. Graphite foil was used around the diameter of the reactants and punches, to prevent reaction with the die and to facilitate ejection of the products. The bolts 80 shown in FIG. 13A were tightened in order to apply 18,000 psi of pressure to the sample via the platens 90.

Figure 14:
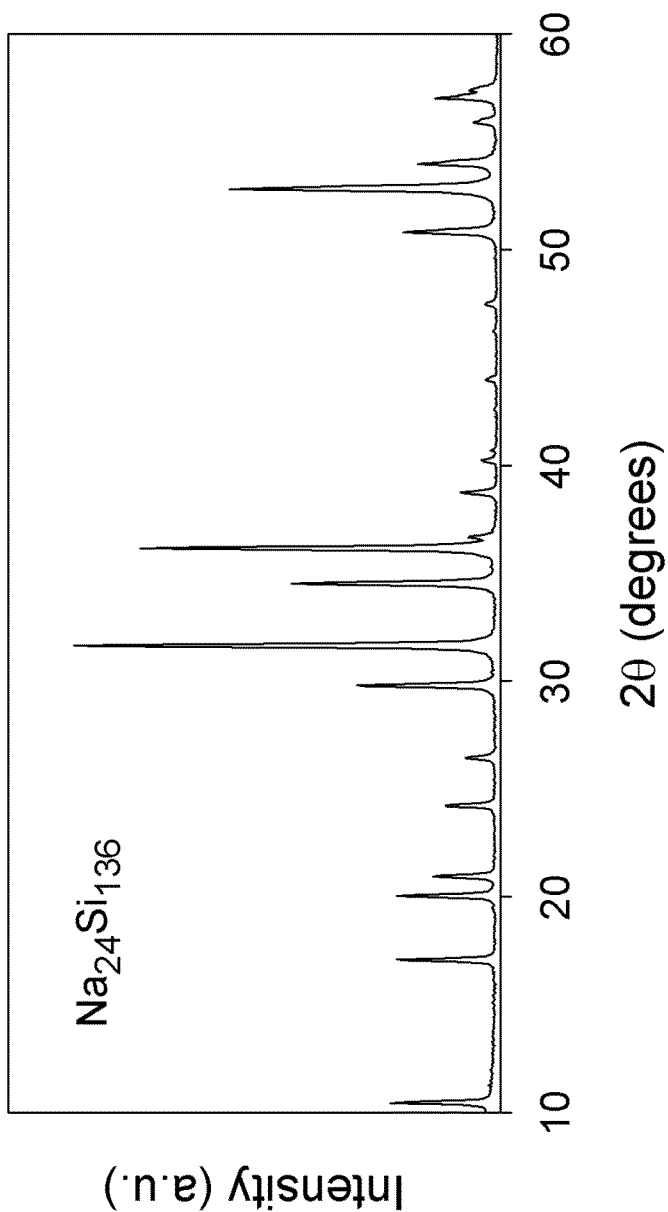

The apparatus was placed inside a pre-heated furnace and heated under dynamic vacuum ($10^{-6}$ torr) for about 6 hours at 650° C. The apparatus was then removed, and the products ejected from the die 30. The products were washed with distilled water to dissolve any unreacted precursor. Large single crystals (~0.5 mm) of $Na_{24}Si_{136}$ were formed. The crystalline product was isolated and characterized. As shown in FIG. 14, powder X-ray diffraction (XRD) confirmed the crystal growth of the $Na_{24}Si_{136}$ specimen, as well as the phase purity of the $Na_{24}Si_{136}$ product.

In the preceding specification, all documents, acts, or information disclosed does not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between. Now that the invention has been described,

What is claimed is:
1. A method for selective preparation of single phase pure intermetallic crystals, comprising the steps of:
positioning a primary reactant into a reaction apparatus;
positioning a secondary reactant into the reaction apparatus;
positioning an inert diffusion facilitating separation layer between the secondary reactant and the primary reactant;
applying heat and pressure to the reaction apparatus; and controlling the release of vapor of at least one chemical constituent of the primary reactant whereby the controlled release results in a change in composition of the primary reactant.

2. The method of claim 1 further comprising encapsulating the outer diameter of the primary reactants, secondary reactants and diffusion facilitating layer with graphite foil.

3. The method of claim 1 wherein the primary reactant is selected from the group consisting of NaSi, NaGe, NaSn, KSi, KGe, KSn, RbSi, RbGe, RbSn, CsSi, CsGe, CsSn, $BaSi_2$, $BaGe_2$, $BaSn_2$, $SrSi_2$, $SrGe_2$, $SrSn_2$, $Na_{1-x}K_xSi_2$, $Na_{1-x}K_xGe_2$, $Na_{1-x}K_xSn_2$, $Na_{1-x}Rb_xSi_2$, $Na_{1-x}Rb_xGe_2$, $Na_{1-x}Rb_xSn_2$, $Na_{1-x}Cs_xSi_2$, $Na_{1-x}Cs_xGe_2$, $Na_{1-x}Cs_xSn_2$, $K_{1-x}Rb_xSi_2$, $K_{1-x}Rb_xGe_2$, $K_{1-x}Rb_xSn_2$, $K_{1-x}Cs_xSi_2$, $K_{1-x}Cs_xGe_2$, $K_{1-x}Cs_xSn_2$, $Rb_{1-x}Cs_xSi_2$, $Rb_{1-x}Cs_xGe_2$, $Rb_{1-x}Cs_xSn_2$, $NaSi_{1-y}Ge_y$, $KSi_{1-y}G_y$, $RbSi_{1-y}Ge_y$, $CsSi_{1-y}Ge_y$, $Na_{1-x}K_xSi_{1-y}Ge_y$, $Na_{1-x}Rb_xSi_{1-y}Ge_y$, $Na_{1-x}Cs_xSi_{1-y}Ge_y$, $K_{1-x}Rb_xSi_{1-y}Ge_y$, $K_{1-x}Cs_xSi_{1-y}Ge_y$, and $Rb_{1-x}Cs_xSi_{1-y}Ge_y$ (0<x, y<1), or any variation, combination, mixture, alloy, or solid solution of any of these compounds.

4. The method of claim 3 wherein the primary reactant is reduced chemically to result in a crystal structure comprising single phase pure intermetallic crystals having less than 100% alkali metal or alkali earth metal occupancy in the crystal structure.

5. The method of claim 3 wherein the primary reactant is reduced by evaporation to result in a crystal structure comprising single phase pure intermetallic crystals having less than 100% alkali metal or alkali earth metal occupancy in the crystal structure.

6. The method of claim 1 wherein the primary reactant is selected from the group consisting of $Na_4Si_4$ and $K_4Si_4$.

7. The method of claim 6 wherein the reactants are heated between about 580° C. and 590° C.

8. The method of claim 6 wherein the reactants are heated between about 650° C. and 670° C.

9. The method of claim 6 wherein the reactants are heated for between about 6 hours and about 8 hours.

10. The method of claim 1 wherein the secondary reactant is positioned above and below the primary reactant.

11. The method of claim 1 wherein the secondary reactant is selected from the group consisting of carbon, graphite and glass.

12. The method of claim 1 wherein the diffusion facilitating layer is selected from the group consisting of NaCl and BaF.

13. A method of producing intermetallic crystals comprising the steps of:
positioning a primary reactant within a reaction apparatus;
applying heat and pressure to the reaction apparatus; and
manually controlling the release of vapor of at least one chemical constituent of the primary reactant whereby the controlled release results in a change in composition of the primary reactant.

14. The method of claim 13 wherein the primary reactant is selected from the group consisting of NaSi, NaGe, NaSn, KSi, KGe, KSn, RbSi, RbGe, RbSn, CsSi, CsGe, CsSn, $BaSi_2$, $BaGe_2$, $BaSn_2$, $SrSi_2$, $SrGe_2$, $SrSn_2$, $Na_{1-x}K_xSi_2$, $Na_{1-x}K_xGe_2$, $Na_{1-x}K_xSn_2$, $Na_{1-x}RbSi_2$, $Na_{1-x}Rb_xGe_2$, $Na_{1-x}Rb_xSn_2$, $Na_{1-x}Cs_xSi_2$, $Na_{1-x}Cs_xGe_2$, $Na_{1-x}Cs_xSn_2$, $K_{1-x}RbSi_2$, $K_{1-x}Rb_xGe_2$, $K_{1-x}Rb_xSn_2$, $K_{1-x}Cs_xSi_2$, $K_{1-x}Cs_xGe_2$, $K_{1-x}Cs_xSn_2$, $Rb_{1-x}Cs_xSi_2$, $Rb_{1-x}Cs_xGe_2$, $Rb_{1-x}Cs_xSn_2$, $NaSi_{1-y}Ge_y$, $KSi_{1-y}G_y$, $RbSi_{1-y}Ge_y$, $CsSi_{1-y}Ge_y$, $Na_{1-x}K_xSi_{1-y}Ge_y$, $Na_{1-x}Rb_xSi_{1-y}Ge_y$, $Na_{1-x}Cs_xSi_{1-y}Ge_y$, $K_{1-x}Rb_xSi_{1-y}Ge_y$, $K_{1-x}Cs_xSi_{1-y}Ge_y$, and $Rb_{1-x}Cs_xSi_{1-y}Ge_y$ (0<x, y<1), or any variation, combination, mixture, alloy, or solid solution of any of these compounds.

15. The method of claim 13 wherein the primary reactant is selected from the group consisting of $Na_4Si_4$ and $K_4Si_4$.

16. The method of claim 13 wherein the secondary reactant is positioned above and below the primary reactant.

17. The method of claim 13 wherein the secondary reactant is selected from the group consisting of carbon, graphite and glass.

18. A single crystal clathrate compound comprising:
a type II clathrate lattice with atoms of silicon as a main framework forming lattice spacings within the framework, wherein the clathrate lattice follows the general formula of $Si_y$, where y indicates the number of Si atoms in the main framework wherein $y \leq 136$; and
guest atoms (A) to selectively occupy the lattice spacings of the clathrate lattice such that the clathrate lattice follows the general formula $A_xSi_y$ wherein 0<x<24.

19. The compound of claim 18 wherein y=136.

20. The compound of claim 18 wherein the guest atom is selected from the group consisting of alkali metals and alkali earth metals.

21. The compound of claim 20 wherein the guest atom is potassium (K).

22. The compound of claim 21 wherein x=24.

* * * * *